United States Patent
Matsushita

(10) Patent No.: US 8,735,989 B2
(45) Date of Patent: May 27, 2014

(54) SEMICONDUCTOR DEVICE THAT INCLUDES MAIN ELEMENT HAVING INSULATED GATE BIPOLAR TRANSISTOR AND SENSE ELEMENT HAVING RESISTOR AND INSULATED GATE BIPOLAR TRANSISTOR

(75) Inventor: Kenichi Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 13/290,991

(22) Filed: Nov. 7, 2011

(65) Prior Publication Data

US 2012/0112241 A1 May 10, 2012

(30) Foreign Application Priority Data

Nov. 8, 2010 (JP) .................................. 2010-250178
Jul. 22, 2011 (JP) .................................. 2011-161130

(51) Int. Cl.
*H01L 29/732* (2006.01)
(52) U.S. Cl.
USPC ................... 257/370; 257/580; 257/E29.198
(58) Field of Classification Search
CPC .................................................. H01L 27/0772
See application file for complete search history.

(56) References Cited

U.S. PATENT DOCUMENTS

| | | | | |
|---|---|---|---|---|
| 5,200,878 A | * | 4/1993 | Sasagawa et al. | 361/98 |
| 5,719,420 A | * | 2/1998 | Kohno et al. | 257/328 |
| 6,218,888 B1 | * | 4/2001 | Otsuki | 327/419 |
| 6,268,990 B1 | * | 7/2001 | Ogura et al. | 361/91.7 |
| 8,384,124 B2 | * | 2/2013 | Hara et al. | 257/143 |
| 2009/0057832 A1 | * | 3/2009 | Kouno | 257/577 |
| 2011/0233684 A1 | | 9/2011 | Matsushita | |

FOREIGN PATENT DOCUMENTS

JP    3361874    1/2003

* cited by examiner

*Primary Examiner* — Stephen W Smoot
(74) *Attorney, Agent, or Firm* — Patterson & Sheridan, LLP

(57) ABSTRACT

According to one embodiment, a semiconductor device includes a main element and a sense element. The main element is connected between a collector terminal and an emitter terminal. The main element has an insulated gate bipolar transistor structure. The sense element is connected in parallel with the main element via a sense resistor between the collector terminal and the emitter terminal. The sense element has an insulated gate bipolar transistor structure with a feedback capacitance larger than a feedback capacitance of the main element.

11 Claims, 5 Drawing Sheets

FIG. 6A
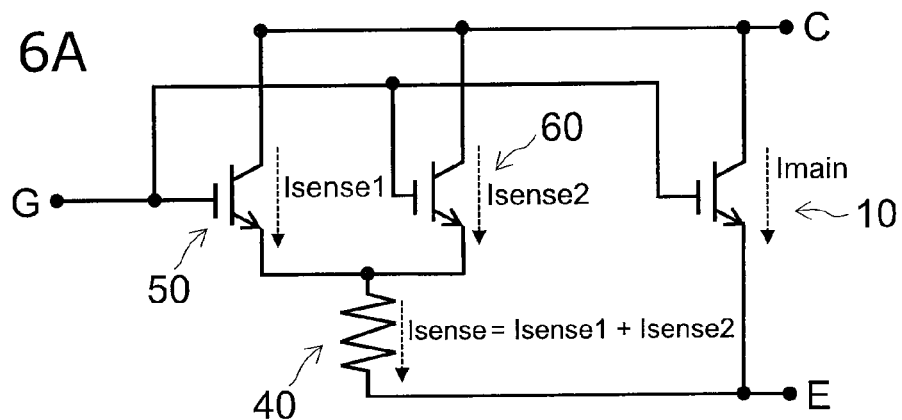
FIG. 6B
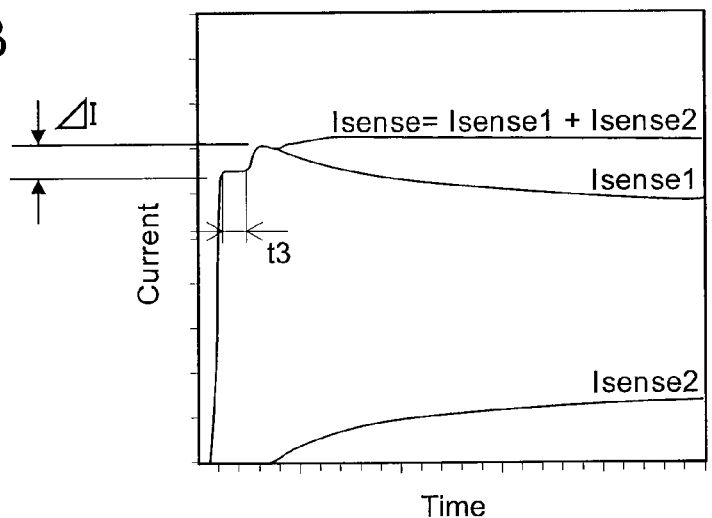
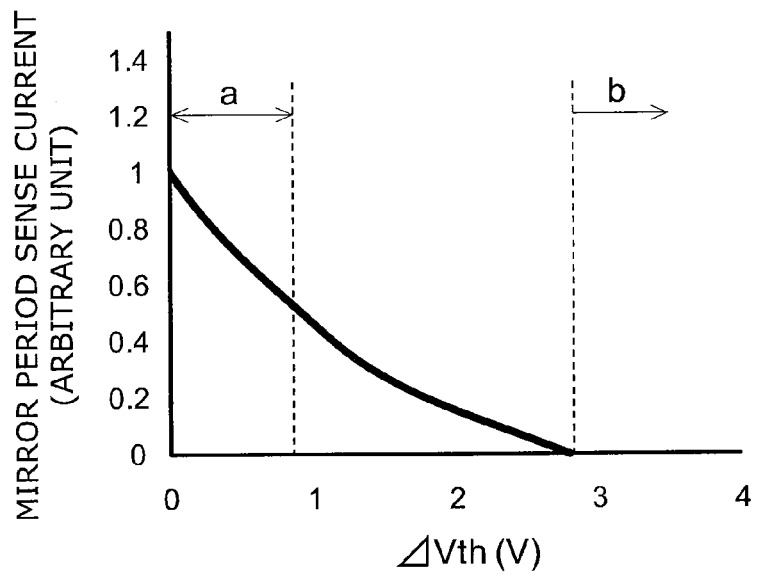
FIG. 7

SEMICONDUCTOR DEVICE THAT INCLUDES MAIN ELEMENT HAVING INSULATED GATE BIPOLAR TRANSISTOR AND SENSE ELEMENT HAVING RESISTOR AND INSULATED GATE BIPOLAR TRANSISTOR

CROSS-REFERENCE TO RELATED APPLICATIONS

This application is based upon and claims the benefit of priority from Japanese Patent Application No. 2010-250178, filed on Nov. 8, 2010 and Japanese Patent Application No. 2011-161130, filed on Jul. 22, 2011; the entire contents of all of which are incorporated herein by reference.

FIELD

Embodiments described herein relate generally to a semiconductor device.

BACKGROUND

For a chip in which a plurality of insulated gate bipolar transistors (IGBTs) are parallel connected, there is known a technique of using some of the IGBTs as sense IGBTs to sense the current of IGBTs (main IGBTs). The emitter electrode of the sense IGBT is connected via a sense resistor to an emitter terminal shared with the main IGBTs. By measuring the voltage drop of the sense resistor, the current flowing in the sense IGBT (sense current) can be measured. However, the problem is that the sense current at the switching time differs from that determined by the ratio of the sense IGBT and the main IGBT during normal operation.

BRIEF DESCRIPTION OF THE DRAWINGS

FIG. 6A is an equivalent circuit diagram of a semiconductor device of another embodiment, FIG. 6B is a turn-on current waveform chart of a sense element in FIG. 6A; and FIG. 7 is a graph showing relation between a relative value of a threshold voltage of a second sense element relative to a threshold voltage of a first sense element and a sense current of the second sense element in the mirror period of the first sense element.

DETAILED DESCRIPTION

According to one embodiment, a semiconductor device includes a main element and a sense element. The main element is connected between a collector terminal and an emitter terminal. The main element has an insulated gate bipolar transistor structure. The sense element is connected in parallel with the main element via a sense resistor between the collector terminal and the emitter terminal. The sense element has an insulated gate bipolar transistor structure with a feedback capacitance larger than a feedback capacitance of the main element.

Figure 3A:
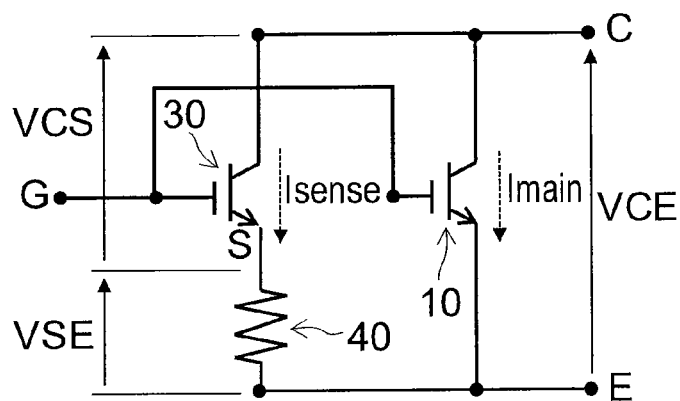
FIGS. 3A and 3B are equivalent circuit diagrams of a semiconductor device of a comparative example.

FIG. 3A shows an equivalent circuit diagram of a semiconductor device of a comparative example having the current sensing function.

This semiconductor device includes a main element 10 having the insulated gate bipolar transistor (IGBT) structure and a sense element 30 having the same insulated gate bipolar transistor structure as the main element 10. The main element 10 is connected between the collector terminal C and the emitter terminal E. The sense element 30 is connected in parallel with the main element 10 via a sense resistor 40 between the collector terminal C and the emitter terminal E.

Figure 3B:
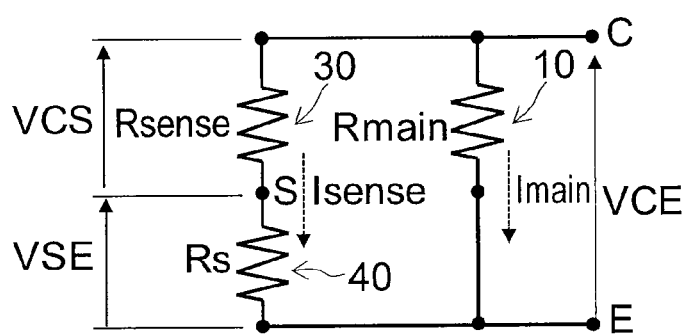

FIG. 3B is an equivalent circuit diagram in which the main element 10 and the sense element 30 are each modeled as a simple resistor. The connection node between the emitter electrode of the sense element 30 and the sense resistor 40 is denoted by S.

The collector-emitter voltage of the main element 10 is denoted by VCE. The current flowing in the main element 10 is denoted by Imain. The resistance of the main element 10 is denoted by Rmain. The voltage between the collector of the sense element 30 and the node S is denoted by VCS. The current flowing in the sense element 30 and the sense resistor 40 is denoted by Isense. The resistance of the sense element 30 is denoted by Rsense. The resistance of the sense resistor 40 is denoted by Rs. Then, the following relations hold.

$$Rsense = VCS/Isense \quad (1)$$

$$Rmain = VCE/Imain \quad (2)$$

$$VCE = VCS + Rs \times Isense \quad (3)$$

These equations (1)-(3) result in the following.

$$Isense = (Rmain/(Rsense + Rs)) \times Imain \quad (4)$$
$$= (1/Sratio \cdot (1 + Rs/Rsense)) \times Imain$$

Here, Sratio denotes the sense ratio Rsense/Rmain.

With Sratio set constant, device simulation was performed to determine Imain and VCE, and Isense was calculated. The area of the main element 10 was set to e.g. 6000 times the area of the sense element 30. That is, the sense ratio Sratio (=Rsense/Rmain) was set to 6000.

Figure 4:
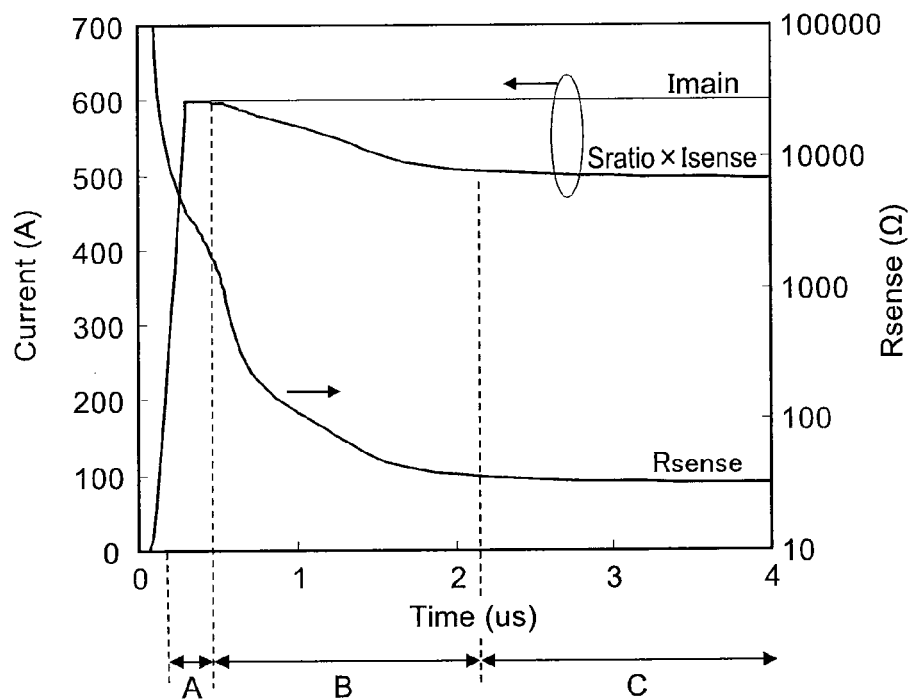
FIG. 4 is a turn-on current waveform chart of the semiconductor device of the comparative example.

FIG. 4 shows the result of this calculation. The horizontal axis represents time (μsec), the left vertical axis represents current (A), and the right vertical axis represents resistance (Ω).

In FIG. 4, the sense current is represented as Isense multiplied by the sense ratio Sratio, i.e., as Sratio×Isense.

In interval A, the main element 10 and the sense element 30 are not turned on. Hence, Rs<<Rsense. Thus, Rs/Rsense in equation (4) is nearly equal to zero.

Hence, Isense=(1/Sratio)×Imain. Thus, Isense is almost determined by the sense ratio. Hence, Sratio×Isense coincides with Imain.

In interval B, the main element 10 and the sense element 30 start to be turned on. Thus, Rs/Rsense becomes non-negligible. Hence, as given by equation (4), the following relation holds.

$$Isense = (1/Sratio \cdot (1 + Rs/Rsense)) \times Imain$$

That is, as the resistance Rsense of the sense element 30 becomes lower, the sense current Isense gradually becomes smaller than Imain/Sratio.

In interval C, switching is almost completed. Rsense is minimized, and the circuit is placed in the normal on-state.

In interval C of the normal on-state, the difference between Imain and Sratio×Isense corresponds to the reduction of the sense current due to the series insertion of the sense resistor 40 in the sense element 30. Hence, Imain can be obtained by multiplying Sratio×Isense by an appropriate correction factor.

However, Isense in intervals A and B is larger than Isense in the normal on-state. Hence, correction by multiplication by the correction factor results in apparently raising the current value in intervals A and B. This causes false sensing of overcurrent, and may unnecessarily stop the normal operation.

There is a proposal for addressing this problem. In this proposal, the threshold voltage of the sense element is set higher than the threshold voltage of the main element. However, the technique of this proposal is ineffective in the case where the rise time triseS of the sense IGBT is shorter than interval B of FIG. 4. Here, the rise time triseS is an index representing the rising speed of the gate voltage and defined as the time required for the gate voltage to rise from 10% to 90%.

Thus, even in such cases, in the embodiment described below, a semiconductor device capable of suppressing the variation of the sense current at the switching time is provided at low cost.

Figure 1:
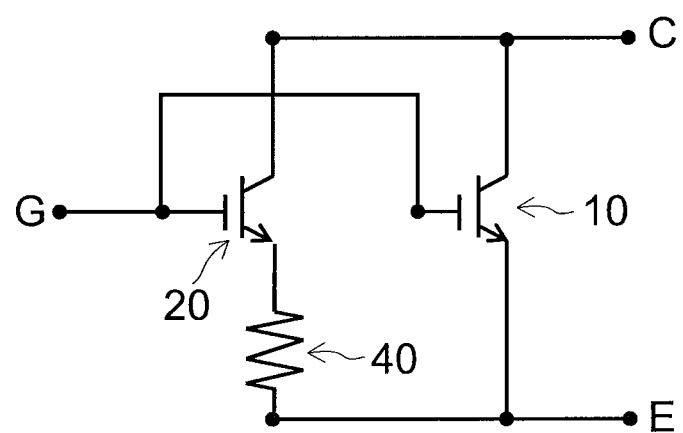
FIG. 1 is an equivalent circuit diagram of a semiconductor device of an embodiment.

FIG. 1 is an equivalent circuit diagram of a semiconductor device of the embodiment.

This semiconductor device has a configuration in which a main element 10 and a sense element 20 are parallel connected between the collector terminal C and the emitter terminal E. The sense element 20 is connected in parallel with the main element 10 between the collector terminal C and the emitter terminal E via a sense resistor 40.

The main element 10 and the sense element 20 have the insulated gate bipolar transistor (IGBT) structure as described later.

The sense element 20 is designed so that the threshold voltage is higher than that of the main element 10, and that the gate-collector parasitic feedback capacitance (mirror capacitance) is larger than that of the main element 10. As a result, the mirror period (or mirror interval) of the gate voltage at turn-on time of the sense element 20 is longer than the mirror period of the gate voltage at turn-on time of the main element 10.

Figure 2:
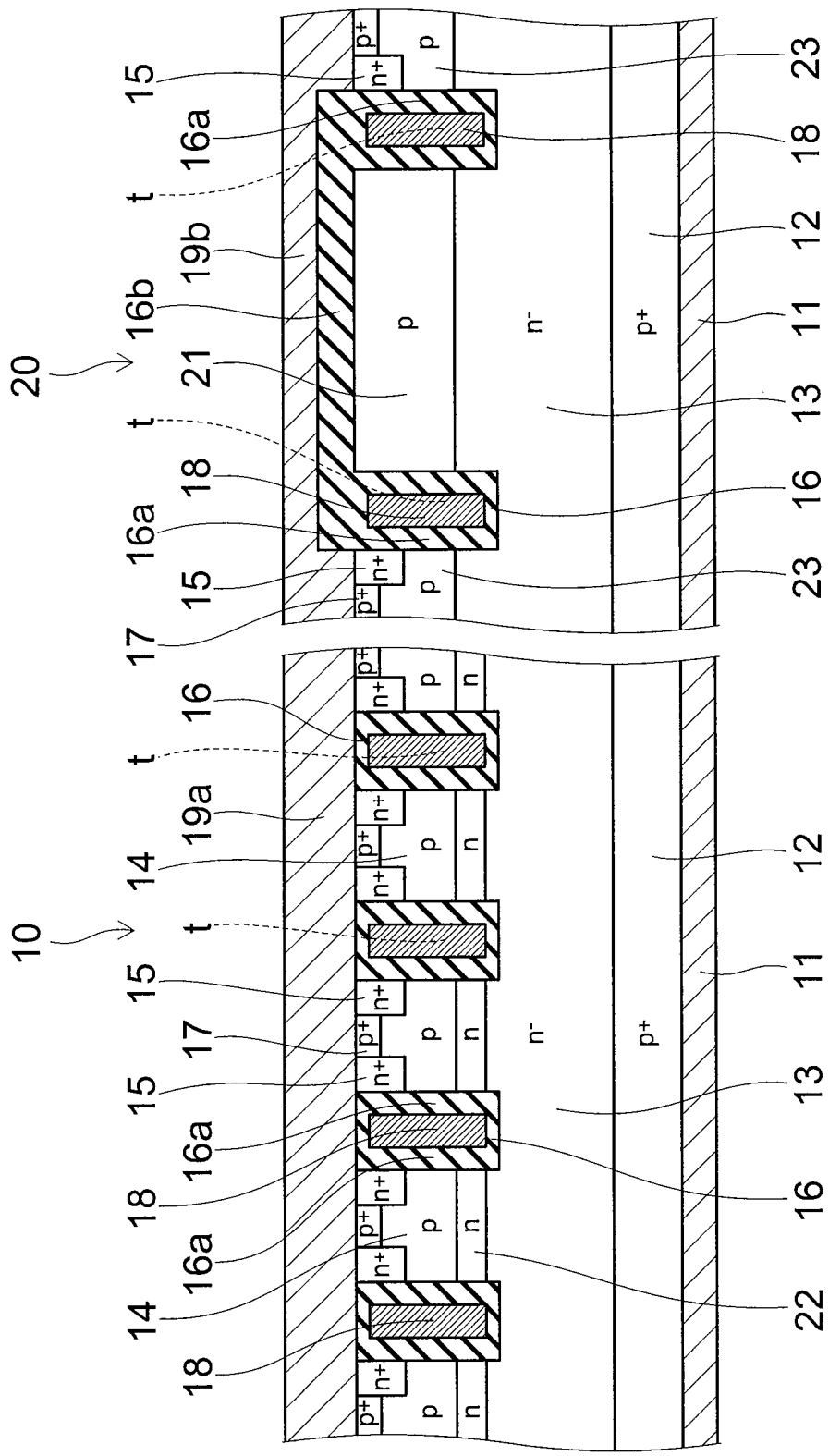
FIG. 2 is a schematic cross-sectional view of the semiconductor device of the embodiment.

FIG. 2 shows an example cross-sectional structure of the semiconductor device of this embodiment including the main element 10 and the sense element 20.

The main element 10 and the sense element 20 are formed monolithically on the same substrate or on one chip. Most of the device region in one chip is occupied by main elements 10. The area (number) of sense elements 20 is far smaller (e.g., one over several thousand) than the area (number) of main elements 10.

In the description of the embodiment, it is assumed that the first conductivity type is p-type and the second conductivity type is n-type. However, it is also possible to set the first conductivity type to n-type and the second conductivity type to p-type. As the semiconductor, silicon is used. Alternatively, semiconductors other than silicon (e.g., compound semiconductors such as SiC and GaN) may be used.

First, the main element 10 is described.

The main element 10 has a vertical IGBT structure. In this structure, the main current flows in the thickness direction of the semiconductor layers, i.e., in the vertical direction connecting the emitter electrode 19a and the collector electrode 11.

A p$^+$-type collector layer (or substrate) 12 is provided on the collector electrode 11. An n$^-$-type base layer 13 is provided as a first base layer on the collector layer 12. An n-type barrier layer 22 is provided on the n$^-$-type base layer 13. A p-type base layer 14 is provided as a second base layer on the n-type barrier layer 22. An n$^+$-type emitter layer 15 and a p$^+$-type contact layer 17 are selectively provided in the surface of the p-type base layer 14.

The n-type impurity concentration of the emitter layer 15 is higher than the n-type impurity concentration of the n$^-$-type base layer 13. The p-type impurity concentration of the contact layer 17 is higher than the p-type impurity concentration of the p-type base layer 14. The n-type impurity concentration of the n-type barrier layer 22 is higher than the n-type impurity concentration of the n$^-$-type base layer 13.

On the front surface side of these semiconductor layers, a plurality of trenches t are formed. The trench t extends from the surface of the p-type base layer 14 to the n$^-$-type base layer 13. That is, the trench t penetrates through the p-type base layer 14 and the n-type barrier layer 22, and the bottom of the trench t is located in the n$^-$-type base layer 13.

On the inner wall (sidewall and bottom) of the trench t, an insulating film 16 is provided. The portion of the insulating film 16 provided on the sidewall of the trench t is referred to as gate insulating film 16a.

The emitter layer 15 is adjacent to the sidewall of the trench t. That is, the emitter layer 15 is adjacent to the gate insulating film 16a.

In the trench t, a gate electrode 18 is provided inside the insulating film 16. The gate electrode 18 is opposed to the p-type base layer 14 across the gate insulating film 16a.

The collector electrode 11 is provided on the surface of the collector layer 12 on the opposite side from the surface provided with the n$^-$-type base layer 13. The collector layer 12 is in ohmic contact with and electrically connected to the collector electrode 11.

On the surface of the emitter layer 15 and the contact layer 17, an emitter electrode 19a is provided. The emitter layer 15 is in ohmic contact with and electrically connected to the emitter electrode 19a. The contact layer 17 is in ohmic contact with the emitter electrode 19a. Hence, the p-type base layer 14 is electrically connected to the emitter electrode 19a via the contact layer 17. Between the gate electrode 18 and the emitter electrode 19a, the insulating film 16 is interposed.

The collector electrode 11 is connected to the collector terminal C shown in FIG. 1. The emitter electrode 19a is connected to the emitter terminal E shown in FIG. 1. Part of the gate electrode 18 is extracted above the trench t and connected to the gate terminal G shown in FIG. 1 via a gate interconnection, not shown.

Relatively, a high potential is applied to the collector electrode 11, and a low potential is applied to the emitter electrode 19a. In this state, a desired gate potential is applied to the gate electrode 18. Then, an inversion layer (n-channel) is formed in the p-type base layer 14 near the interface with the gate insulating film 16a. For instance, a positive potential relative to the emitter potential placed at the ground potential or a negative potential is applied to the gate electrode 18. A positive potential higher than the gate potential is applied to the collector electrode 11.

Thus, electrons are injected from the emitter layer 15 via the n-channel into the n$^-$-type base layer 13, resulting in the on-state. Furthermore, at this time, holes are injected from the collector layer 12 into the n$^-$-type base layer 13. Electrons injected into the n$^-$-type base layer 13 flow through the collector layer 12 to the collector electrode 11. Holes injected into the n$^-$-type base layer 13 traverse the n-type barrier layer 22 and flow through the p-type base layer 14 and the p$^+$-type contact layer 17 to the emitter electrode 19a. At this time, because holes traverse the n-type barrier layer 22, the hole concentration becomes higher than approximately $10^{16}/cm^3$. Hence, the resistance of the n$^-$-type base layer 13 significantly decreases.

Next, the sense element 20 is described.

The sense element 20 also has a vertical IGBT structure. In this structure, the main current flows in the thickness direction of the semiconductor layers, i.e., in the vertical direction connecting the emitter electrode 19b and the collector electrode 11.

The component structure of the collector electrode 11, collector layer 12, n$^-$-type base layer 13, emitter layer 15, contact layer 17, and trench gate is the same between the main element 10 and the sense element 20.

The n-type barrier layer 22 is not provided in the sense element 20. Thus, the impurity concentration of the p-type base layer 23 of the sense element 20 can be made higher than that of the p-type base layer 14 of the main element 10. Hence, without additional process steps, the threshold voltage of the sense element 20 can be made higher than the threshold voltage of the main element 10.

Also in the sense element 20, a p$^+$-type collector layer 12 is provided on the collector electrode 11. An n$^-$-type base layer 13 is provided as a first base layer on the collector layer 12. A p-type base layer 23 is provided as a second base layer on the n$^-$-type base layer 13. An n$^+$-type emitter layer 15 and a p$^+$-type contact layer 17 are selectively provided in the surface of the p-type base layer 23.

On the front surface side of these semiconductor layers, a plurality of trenches t are formed. The trench t extends from the surface of the p-type base layer 23 to the n$^-$-type base layer 13. That is, the trench t penetrates through the p-type base layer 23, and the bottom of the trench t is located in the n$^-$-type base layer 13.

On the inner wall (sidewall and bottom) of the trench t, an insulating film 16 is provided. The portion of the insulating film 16 provided on the sidewall of the trench t is referred to as gate insulating film 16a.

The emitter layer 15 is adjacent to the sidewall of the trench t. That is, the emitter layer 15 is adjacent to the gate insulating film 16a.

In the trench t, a gate electrode 18 is provided inside the insulating film 16. The gate electrode 18 is opposed to the p-type base layer 23 across the gate insulating film 16a.

The collector electrode 11 is provided on the surface of the collector layer 12 on the opposite side from the surface provided with the n$^-$-type base layer 13. The collector layer 12 is in ohmic contact with and electrically connected to the collector electrode 11.

On the surface of the emitter layer 15 and the contact layer 17, an emitter electrode 19b is provided. The emitter layer 15 is in ohmic contact with and electrically connected to the emitter electrode 19b. The contact layer 17 is in ohmic contact with the emitter electrode 19b. Hence, the p-type base layer 23 is electrically connected to the emitter electrode 19 via the contact layer 17. Between the gate electrode 18 and the emitter electrode 19b, the insulating film 16 is interposed.

The collector electrode 11 is connected to the collector terminal C shown in FIG. 1. The emitter electrode 19b of the sense element 20 is separated from the emitter electrode 19a of the main element 10, and connected to the emitter terminal E via the sense resistor 40 shown in FIG. 1. Part of the gate electrode 18 is extracted above the trench t and connected to the gate terminal G shown in FIG. 1 via a gate interconnection, not shown.

In addition to the above components, the sense element 20 further includes a p-type floating layer 21. The p-type floating layer 21 is provided between adjacent trenches t on the n$^-$-type base layer 13 of the sense element 20. The trench t separates the p-type floating layer 21 from the p-type base layer 23 in the lateral direction generally parallel to the major surface of the collector layer (substrate) 12.

In the p-type floating layer 21, the emitter layer 15 is not formed. Furthermore, an insulating film 16b is provided on the p-type floating layer 21. By the insulating film 16b, the p-type floating layer 21 is isolated from the emitter electrode 19b. That is, the p-type floating layer 21 is not connected to the emitter electrode 19b. Furthermore, the p-type floating layer 21 is not connected also to the other electrodes. Thus, the p-type floating layer 21 is electrically floating.

Also in the sense element 20, relatively, a high potential is applied to the collector electrode 11, and a low potential is applied to the emitter electrode 19b. In this state, a desired gate potential is applied to the gate electrode 18. Then, an inversion layer (n-channel) is formed in the p-type base layer 23 near the interface with the gate insulating film 16a.

Thus, electrons are injected from the emitter layer 15 via the n-channel into the n$^-$-type base layer 13, resulting in the on-state. Furthermore, at this time, holes are injected from the collector layer 12 into the n$^-$-type base layer 13. Electrons injected into the n$^-$-type base layer 13 flow through the collector layer 12 to the collector electrode 11. Holes injected into the n$^-$-type base layer 13 flow through the p-type base layer 23 and the p$^+$-type contact layer 17 to the emitter electrode 19b.

The p-type floating layer 21 is not connected to the emitter electrode 19b. Hence, no holes flow in the p-type floating layer 21. By forming such a region where no holes flow, holes are accumulated at the emitter side surface of the n$^-$-type base layer 13. This hole accumulation facilitates injection of electrons into the n$^-$-type base layer 13. As a result, the on-voltage (on-resistance) can be reduced.

Because this p-type floating layer 21 is provided in the sense element 20, the sense element 20 has a higher feedback capacitance (gate-collector capacitance) than the main element 10. That is, a capacitive coupling via the p-type floating layer 21 is added in parallel between the gate electrode 18 and the collector electrode 11.

Here, device simulation was performed to calculate the main current Imain and the sense current Isense. The areas of the main element and the sense element are set equal to clarify the effect. The current waveforms do not coincide between the main element and the sense element. This is because the device structures are different, and hence the I-V (current-voltage) characteristics are also different.

Figure 5A:
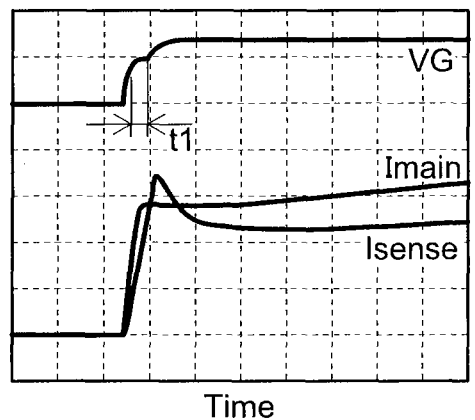
FIGS. 5A and 5B are turn-on current waveform chart of the semiconductor device of the embodiment.

FIG. 5A shows the simulation result of a device of a comparative example using the main element 10 and a sense element which is an IGBT having the same configuration as the main element 10. FIG. 5A also shows the waveform of the gate voltage VG of the sense element of the comparative example.

Figure 5B:
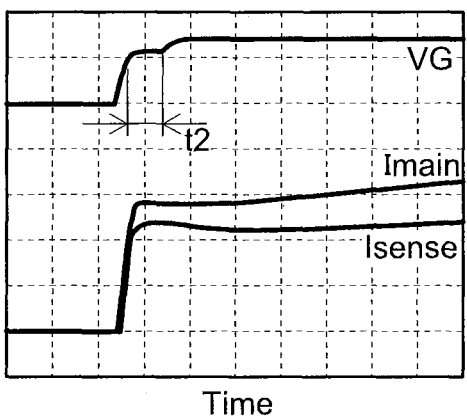

FIG. 5B shows the simulation result of a device using the main element 10 and a sense element which is the sense element 20 of the embodiment. FIG. 5B also shows the waveform of the gate voltage VG of the sense element 20 of the embodiment.

In FIGS. 5A and 5B, the horizontal axis represents time, and the vertical axis represents current and gate voltage.

At the rise time of the gate voltage VG, due to the feedback capacitance (mirror capacitance), the rising rate of the gate voltage VG temporarily slackens, and produces a mirror period t1, t2 where the waveform becomes nearly flat.

As shown in FIG. 5A, in the case of using a sense element having the same configuration as the main element 10, the sense current significantly rises immediately after the mirror period t1.

In contrast, the sense element 20 of the embodiment has a larger feedback capacitance than the main element 10. Hence, the mirror period t2 of the sense element 20 is longer than the mirror period t1 of the main element 10.

As a result, as shown in FIG. 5B, the rising of the sense current Isense is suppressed. This decreases the variation in the difference between the sense current Isense and the main current Imain. Hence, by multiplying the sense current Isense by an appropriate correction factor corresponding to the difference from the main current Imain, the main current Imain can be accurately obtained without apparent overestimation of the peak value.

Here, between FIGS. 5A and 5B, the gate waveforms are different. However, typically, the area of the main element is often several thousand times the area of the sense element. Hence, there is no case where the gate voltage waveform is varied.

If an excessive value of Imain is sensed based on the comparison with e.g. reference values, then the protection circuit, not shown, connected to the gate terminal G decreases or turns off the gate voltage to limit the current flowing in the device.

Because the threshold voltage of the sense element 20 is made higher than that of the main element 10, the sense element 20 is turned off earlier than the main element 10. This can prevent current concentration at turn-off time on the sense element 20 having a smaller area than the main element 10.

In the structure shown in FIG. 2, components common to the main element 10 and the sense element 20 are formed simultaneously in the same process step. Furthermore, the p-type floating layer 21 is formed simultaneously in the same process step as the p-type base layers 14, 23. The process itself is common to the main element 10 and the sense element 20 except that the mask pattern for forming the trenches t is made different. That is, the main element 10 and the sense element 20 different in feedback capacitance can be formed simultaneously in the same process.

Here, the sense element 20 is not limited to the structure shown in FIG. 2 as long as its feedback capacitance (gate-collector capacitance) is larger than that of the main element 10.

By varying the impurity concentration of the region where the channel is formed, for instance, the threshold voltage of the main element 10 and the threshold voltage of the sense element 20 can be made different. For instance, the p-type impurity concentration of the p-type base layer 23 of the sense element 20 can be made higher than the p-type impurity concentration of the p-type base layer 14 of the main element 10. Thus, the threshold voltage of the sense element 20 can be made higher than the threshold voltage of the main element 10.

Besides, the threshold voltage of the main element 10 and the threshold voltage of the sense element 20 can be made different also by varying e.g. the conductivity of the gate electrode, the gate resistance, and the thickness of the gate insulating film.

FIG. 6A is an equivalent circuit diagram of a semiconductor device of an alternative embodiment.

This semiconductor device also has a configuration in which a main element 10 and a sense element are parallel connected between the collector terminal C and the emitter terminal E. However, the sense element includes a first sense element 50 and a second sense element 60.

The first sense element 50 and the second sense element 60 are both connected in parallel with the main element 10 between the collector terminal C and the emitter terminal E via a sense resistor 40.

The first sense element 50 and the second sense element 60 are parallel connected between the collector terminal C and the sense resistor 40.

The main element 10, the first sense element 50, and the second sense element 60 have the insulated gate bipolar transistor (IGBT) structure, and are formed monolithically on the same substrate or on one chip. Most of the device region in one chip is occupied by main elements 10. The area (number) of first sense elements 50 and second sense elements 60 is far smaller (e.g., one over several thousand) than the area (number) of main elements 10.

The cross-sectional structure of the first sense element 50 and the second sense element 60 is e.g. the same as that of the main element 10 shown in FIG. 2 described above. Alternatively, the cross-sectional structure of the main element 10, the first sense element 50, and the second sense element 60 may be the same as that of the sense element 20 of the above embodiment shown in FIG. 2.

The threshold voltage of the main element 10 and the threshold voltage of the first sense element 50 are equal. The threshold voltage of the second sense element 60 is higher than the threshold voltage of the main element 10 and the threshold voltage of the first sense element 50. Thus, the second sense element 60 is turned on after the completion of the mirror period of the gate voltage of the first sense element 50.

By varying the impurity concentration of the region where the channel is formed (the p-type base layer 14 or the p-type base layer 23 in FIG. 2), for instance, the threshold voltage of the second sense element 60 can be made higher than the threshold voltage of the first sense element 50.

Alternatively, the threshold voltage of the second sense element 60 can be made higher than the threshold voltage of the first sense element 50 also by varying e.g. the conductivity of the gate electrode, the gate resistance, and the thickness of the gate insulating film.

Here, in the configuration of FIG. 6A, device simulation was performed to calculate the sense current Isense. The sense current Isense is the sum of the first sense current Isense1 flowing in the first sense element 50 and the second sense current Isense2 flowing in the second sense element 60.

FIG. 6B shows the simulation result. The horizontal axis represents time, and the vertical axis represents current.

In the configuration shown in FIG. 6A, the threshold voltage of the second sense element 60 is made higher than the threshold voltage of the first sense element 50 so that the second sense element 60 is turned on after the completion of the mirror period t3 of the first sense element 50.

Thus, the step difference ΔI of the current waveform at the rise time of the sense current Isense can be made smaller than that in the case of using only one sense element. Furthermore, after the second sense element 60 is turned on, the decrease of the current of the first sense element 50 is compensated by the current of the second sense element 60. This can suppress the decrease of the sense current Isense after the mirror period.

As a result, the configuration shown in FIG. 6A also decreases the variation in the difference between the sense current Isense and the main current Imain at the switching time. Hence, the main current Imain can be accurately sensed from the sense current Isense.

By controlling the threshold voltage of the second sense element 60 relative to the first sense element 50, the inventor successfully confirmed the simulation result indicating that ΔI shown in FIG. 6B described above can be suppressed to improve the rising of the sense current Isense.

FIG. 7 shows the simulation result.

The horizontal axis represents the relative value ΔVth (V) of the threshold voltage of the second sense element 60 relative to the threshold voltage of the first sense element 50 and the main element 10.

The vertical axis represents the sense current Isense2 of the second sense element 60 in the mirror period t3 of the first sense element 50. The sense current is measured by an arbitrary unit, with the value equal to 1 for ΔVth=0.

In the conventional techniques, the relative value ΔVth of the threshold voltage of the sense element relative to the threshold voltage of the main element has been set to within a range "a" smaller than 1. In contrast, in this embodiment, the relative value ΔVth of the threshold voltage of the second sense element 60 relative to the threshold voltage of the first sense element 50 is set to within a range "b" equal to or more than approximately 2.8 V. Thus, Isense2 in the mirror period t3 of the second sense element 60 can be set to zero.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a main element connected between a collector terminal and an emitter terminal and having an insulated gate bipolar transistor structure; and
   a sense element connected in parallel with the main element via a sense resistor between the collector terminal and the emitter terminal, and having an insulated gate bipolar transistor structure with a feedback capacitance larger than a feedback capacitance of the main element.

2. The device according to claim 1, wherein the sense element has a higher threshold voltage than the main element.

3. The device according to claim 1, wherein
   the main element and the sense element each include:
      a collector electrode;
      a collector layer of a first conductivity type provided on the collector electrode;
      a first base layer of a second conductivity type provided on the collector layer;
      a second base layer of the first conductivity type provided on the first base layer;
      a gate insulating film provided on an inner wall of a trench extending from a surface of the second base layer to the first base layer;
      a gate electrode provided inside the gate insulating film in the trench;
      an emitter layer of the second conductivity type selectively provided adjacent to the trench in the surface of the second base layer; and
      an emitter electrode connected to the emitter layer and the second base layer, and
   the sense element further includes:
      a floating layer of the first conductivity type provided adjacent to the trench and on the first base layer of the sense element and in an electrically floating state.

4. The device according to claim 3, wherein the trench of the sense element separates the floating layer from the second base layer of the sense element in a lateral direction generally parallel to a major surface of the collector layer of the sense element.

5. The device according to claim 1, wherein the sense element has a longer mirror period at turn-on time than the main element.

6. The device according to claim 1, wherein the main element and the sense element are formed monolithically on one chip.

7. The device according to claim 6, wherein area of the sense element is smaller than area of the main element.

8. A semiconductor device comprising:
   a main element connected between a collector terminal and an emitter terminal and having an insulated gate bipolar transistor structure;
   a first sense element connected in parallel with the main element via a sense resistor between the collector terminal and the emitter terminal, and having an insulated gate bipolar transistor structure with a threshold voltage equal to a threshold voltage of the main element; and
   a second sense element connected in parallel with the first sense element between the collector terminal and the sense resistor, and having an insulated gate bipolar transistor structure with a threshold voltage higher than a threshold voltage of the first sense element.

9. The device according to claim 8, wherein relative value of the threshold voltage of the second sense element relative to the threshold voltage of the first sense element is equal to or more than 2.8 V.

10. The device according to claim 8, wherein the main element, and the first sense element, and the second sense element are formed monolithically on one chip.

11. The device according to claim 10, wherein area of the first sense element and the second sense element is smaller than area of the main element.

* * * * *